US009278466B2

(12) United States Patent
Wuister et al.

(10) Patent No.: US 9,278,466 B2
(45) Date of Patent: Mar. 8, 2016

(54) IMPRINT LITHOGRAPHY METHOD AND APPARATUS

(71) Applicant: ASML NETHERLANDS B.V., Veldhoven (NL)

(72) Inventors: Sander Frederik Wuister, Eindhoven (NL); Vadim Yevgenyevich Banine, Helmond (NL); Johan Frederik Dijksman, Weert (NL); Yvonne Wendela Kruijt-Stegeman, Eindhoven (NL); Jeroen Herman Lammers, Eindhoven (NL); Roelof Koole, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/605,637

(22) Filed: Jan. 26, 2015

(65) Prior Publication Data
US 2015/0136324 A1 May 21, 2015

Related U.S. Application Data

(63) Continuation of application No. 12/869,381, filed on Aug. 26, 2010, now Pat. No. 8,961,801.

(60) Provisional application No. 61/237,882, filed on Aug. 28, 2009.

(51) Int. Cl.
C03C 15/00 (2006.01)
B29C 43/34 (2006.01)
(Continued)

(52) U.S. Cl.
CPC .............. B29C 43/34 (2013.01); B29C 43/021 (2013.01); B29C 43/58 (2013.01); B44C 1/20 (2013.01);
(Continued)

(58) Field of Classification Search
CPC .......... B44C 1/20; B82Y 10/00; B82Y 40/00; G03F 7/0002; G03F 7/0027
USPC .................. 216/41, 42, 44; 430/101; 977/887
See application file for complete search history.

(56) References Cited

U.S. PATENT DOCUMENTS 4,731,155 A 3/1988 Napoli et al.
5,772,905 A 6/1998 Chou
(Continued)

FOREIGN PATENT DOCUMENTS

JP 2004-335775 11/2004
JP 2009-182075 8/2009
(Continued)

OTHER PUBLICATIONS

J. Haisma, "Mold-assisted nanolithography. A process for reliable pattern replication", J. Vac. Sci. Technol. B14(6), Nov./Dec. 1996, pp. 4124-4128.

(Continued)

Primary Examiner — Binh X Tran
(74) Attorney, Agent, or Firm — Pillsbury Winthrop Shaw Pittman LLP

(57) ABSTRACT

In an embodiment, there is provided an imprint lithography method that includes providing a first amount of imprintable medium on a first area of a substrate, the first amount of imprintable medium, when fixed, having a first etch rate; and providing a second amount of imprintable medium on a second, different area of the substrate, the second amount of imprintable medium, when fixed, having a second, different etch rate.

20 Claims, 7 Drawing Sheets

(51) Int. Cl.
- B44C 1/20 (2006.01)
- B82Y 10/00 (2011.01)
- B82Y 40/00 (2011.01)
- G03F 7/00 (2006.01)
- B29C 43/02 (2006.01)
- B29C 43/58 (2006.01)
- B29K 101/12 (2006.01)

(52) U.S. Cl.
CPC ............... *B82Y 10/00* (2013.01); *B82Y 40/00* (2013.01); *G03F 7/0002* (2013.01); *B29C 2043/025* (2013.01); *B29K 2101/12* (2013.01)

(56) References Cited

U.S. PATENT DOCUMENTS

| | | | |
|---|---|---|---|
| 6,334,960 | B1 | 1/2002 | Willson et al. |
| 2004/0124566 | A1 | 7/2004 | Sreenivasan et al. |
| 2005/0274693 | A1 | 12/2005 | Heidari et al. |
| 2006/0144275 | A1 | 7/2006 | Kolesnychenko et al. |
| 2009/0189306 | A1 | 7/2009 | Terasaki et al. |
| 2009/0212012 | A1 | 8/2009 | Brooks et al. |
| 2010/0072665 | A1* | 3/2010 | Imai ............... B29C 33/02 264/293 |
| 2010/0279228 | A1* | 11/2010 | Davis ............... B82Y 10/00 430/286.1 |
| 2011/0143544 | A1* | 6/2011 | Goto ............... B82Y 10/00 438/703 |
| 2012/0032377 | A1* | 2/2012 | Montelius ......... B82Y 10/00 264/408 |

FOREIGN PATENT DOCUMENTS

| | | |
|---|---|---|
| JP | 2010-076219 | 4/2010 |
| WO | 02/067055 | 8/2002 |

OTHER PUBLICATIONS

Japanese Office Action mailed Apr. 18, 2012 in corresponding Japanese Patent Application No. 2010-184511.

* cited by examiner

IMPRINT LITHOGRAPHY METHOD AND APPARATUS

This application is a continuation U.S. patent application Ser. No. 12/869,381, filed Aug. 26, 2010, now U.S. Pat. No. 8,961,801, which application claims priority and benefit under 35 U.S.C. §119(e) to U.S. Provisional Patent Application No. 61/237,882, filed on Aug. 28, 2009. The contents of each of the foregoing applications are incorporated herein in its entirety by reference.

FIELD

The present invention relates to an imprint lithography method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve bringing together a patterned surface of an imprint template and a layer of imprintable medium (e.g., moving the imprint template toward the imprintable medium, or moving the imprintable medium toward the imprint template, or both) such that the imprintable medium flows into recesses in the patterned surface and is pushed aside by protrusions on the patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state) and the patterned surface of the imprint template and the patterned imprintable medium are separated. The substrate and patterned imprintable medium are then typically processed further in order to pattern or further pattern the substrate. The imprintable medium is typically provided in the form of droplets on the surface of a substrate to be patterned, but may alternatively be provided using spin coating or the like.

In optical lithography, where a beam of radiation is passed through or reflected off a patterning device (such as a mask or the like), the radiation beam will be patterned according to the pattern provided by the patterning device. The patterned radiation beam is then projected onto a substrate in order to provide one or more patterns on that substrate. Due to non-uniformities in the patterning device, or other elements of an optical lithography apparatus, the pattern projected onto a substrate may not be as intended. For example, heating of the patterning device or a projection lens used to project the patterned radiation beam onto the substrate may cause the patterning device or lens to deform, which may in turn introduce non-uniformities into the patterned radiation beam that is projected onto the substrate. Non-uniformities in the pattern provided on the substrate may comprise, for example, an increase or a decrease in a dimension of a pattern of the radiation beam and thus in a feature provided on the substrate. It is desirable to ensure that the pattern features are provided on the substrate in a uniform and consistent manner across the substrate.

In order to overcome the problem of non-uniformities in optical lithography, the radiation dose provided by one or more parts of the radiation beam may be controlled in order to change the dose of radiation that is provided on different areas of the substrate. For instance, the dose of radiation may be decreased in areas where it is known that non-uniformities in the lithographic apparatus (or during subsequent processing) would otherwise result in pattern features being applied to the substrate with dimensions that are larger than intended. Similarly, the dose of radiation may be increased if it is known that the non-uniformities in the lithographic apparatus will result in pattern features having dimensions smaller than intended.

SUMMARY

In imprint lithography, similar problems can be encountered, but cannot be overcome in the manner discussed above in relation to optical lithography (i.e. by changing the local dose of radiation). For instance, in imprint lithography, the imprint template is the patterning device. When the imprint template is constructed, a non-uniformity in a pattern feature of the imprint template may arise, for example, due to a local variation in process conditions used in the manufacture of the imprint template. Such variation may include, for example, a plasma concentration, an e-beam writing error and the like. During an imprint, the imprint template is imprinted into imprintable medium. In one example, actinic radiation (e.g. UV radiation) is used to irradiate the imprintable medium to fix the pattern provided in the imprintable medium by the imprint template. Thus, it will be appreciated that a change in dose of the actinic radiation will not and cannot have an affect on the dimensions of the pattern features provided on the substrate, since the dimensions of these pattern features are dictated by the dimensions of the pattern features of the imprint template which are fixed. Thus, a non-uniformity in an imprint template still presents a problem.

It is an aim of an embodiment of the present invention to provide an imprint lithography method and apparatus that obviates or mitigates at least one problem of the art, whether identified herein or elsewhere, or which provides an alternative to an existing imprint lithography method and apparatus.

According to an aspect, there is provided an imprint lithography method comprising; providing a first amount of imprintable medium on a first area of a substrate, the first amount of imprintable medium, when fixed, having a first etch rate; and providing a second amount of imprintable medium on a second, different area of the substrate, the second amount of imprintable medium, when fixed, having a second, different etch rate.

A location, and/or extent (e.g. spatial extent, such as an area that is covered), and/or etch rate of the first amount of imprintable medium, and/or a location, and/or extent (e.g. spatial extent, such as an area that is covered), and/or etch rate of the second amount of imprintable medium, is related to a property of an imprint template that is to be used to imprint a pattern into the first amount of imprintable medium and second amount of imprintable medium. The property may be a uniformity profile of the imprint template, for example a uniformity profile of a dimension (e.g. actual dimensions as opposed to intended dimensions) of pattern features of the imprint template. The profile may be at least indicative of how one or more dimensions (e.g. widths or lengths) of the pattern features differ from intended dimensions.

Alternatively or additionally, a location, and/or extent (e.g. spatial extent, such as an area that is covered), and/or etch rate of the first amount of imprintable medium, and/or a location, and/or extent (e.g. spatial extent, such as an area that is covered), and/or etch rate of the second amount of imprintable medium, is related to a property of processing of pattern features that have been provided on the substrate. The property may be a bake or etch profile of a subsequent, for example a uniformity profile of the process (e.g. actual properties as opposed to intended properties), which may correspond to pattern features on the substrate having a dimension that was not intended (i.e. that does not conform to an intended dimension). The profile may be at least indicative of how one or more dimensions (e.g., widths or lengths) of the pattern features on the template would otherwise differ from intended dimensions.

For an area of the substrate onto which a part of an imprint template is to be imprinted, one or more of the following may be undertaken: if the part of the imprint template for that area of the substrate has a dimension substantially as intended, that area of the substrate is provided with an amount of imprintable medium having a normal etch rate; and/or if a part of the imprint template for that area of the substrate has a dimension smaller than intended, that area of the substrate is provided with an amount of imprintable medium having an etch rate that is lower than the normal etch rate; and/or if a part of the imprint template for that area of the substrate has a dimension larger than intended, that area of the substrate is provided with an amount of imprintable medium having an etch rate that is higher than the normal etch rate.

Alternatively or additionally, for an area of the substrate onto which a part of an imprint template is to be imprinted, one or more of the following may be undertaken: if the processing of pattern features provided by that imprint would result in a pattern feature on that area of the substrate having a dimension being substantially as intended, that area of the substrate is provided with an amount of imprintable medium having a normal etch rate; and/or if the processing of pattern features provided by that imprint would result in a pattern feature on that area of the substrate having a dimension being smaller than intended, that area of the substrate is provided with an amount of imprintable medium having an etch rate that is lower than the normal etch rate; and/or if the processing of pattern features provided by that imprint would result in a pattern feature on that area of the substrate having a dimension being larger than intended, that area of the substrate is provided with an amount of imprintable medium having an etch rate that is higher than the normal etch rate.

The first etch rate may be different from the second etch rate due to a difference in an amount of etch resistant material in the first amount of imprintable medium and the second amount of imprintable medium.

The first amount of imprintable medium may be provided by the provision of a first component and the provision of a second component, an amount of the second component dictating the etch rate of the first amount of imprintable medium when fixed; and/or the second amount of imprintable medium may be provided by the provision of a first component and the provision of a second component, an amount of the second component dictating the etch rate of the second amount of imprintable medium when fixed. The amount of the second component may be different for different areas of the substrate. The second component may be increased for successive imprints on the substrate, or decreased for successive imprints on the substrate.

The first amount of imprintable medium may be provided by the provision of a first component that, when fixed, has a first etch rate, and a second component that, when fixed, has a second, different etch rate, a ratio of the first to second component dictating the overall etch rate of the first amount of imprintable medium; and/or the second amount of imprintable medium may be provided by the provision of a first component that, when fixed, has a first etch rate, and a second component that, when fixed, has a second, different etch rate, a ratio of the first to second component dictating the overall etch rate of the second amount of imprintable medium. The ratio may be different for different areas of the substrate. The ratio may be increased for successive imprints on the substrate, or decreased for successive imprints on the substrate.

The first and second components may be provided together. The first and second components may be provided separately.

The first and second amounts of imprintable medium may be provided in parallel, in series, or in any other manner.

The first amount of imprintable medium, and/or the second amount of imprintable medium, may be provided in a liquid form, and then subsequently fixed by exposure to radiation, or by heating, or by cooling, or by evaporation of a solvent.

The first amount of imprintable medium, and/or the second amount of imprintable medium, may be provided in the form of one or more droplets.

The first amount of imprintable medium and second amount of imprintable medium may be located within a single imprint area, so that an imprint template may be used to simultaneously imprint a pattern into the first amount of imprintable medium and second amount of imprintable medium.

According to an aspect, there is provided an imprint lithography apparatus, comprising: an imprintable medium dispenser; a controller configured to control the imprintable medium dispenser, the controller configured to control the imprintable medium dispenser in order to: provide a first amount of imprintable medium on a first area of a substrate onto which a pattern is to be imprinted, the first amount of imprintable medium, when fixed, having a first etch rate; and provide a second amount of imprintable medium on a second, different area of the substrate, the second amount of imprintable medium, when fixed, having a second, different etch rate.

BRIEF DESCRIPTION OF THE DRAWINGS

Specific embodiments of the invention will be described with reference to the accompanying Figures, in which.

DETAILED DESCRIPTION

Figure 1A:
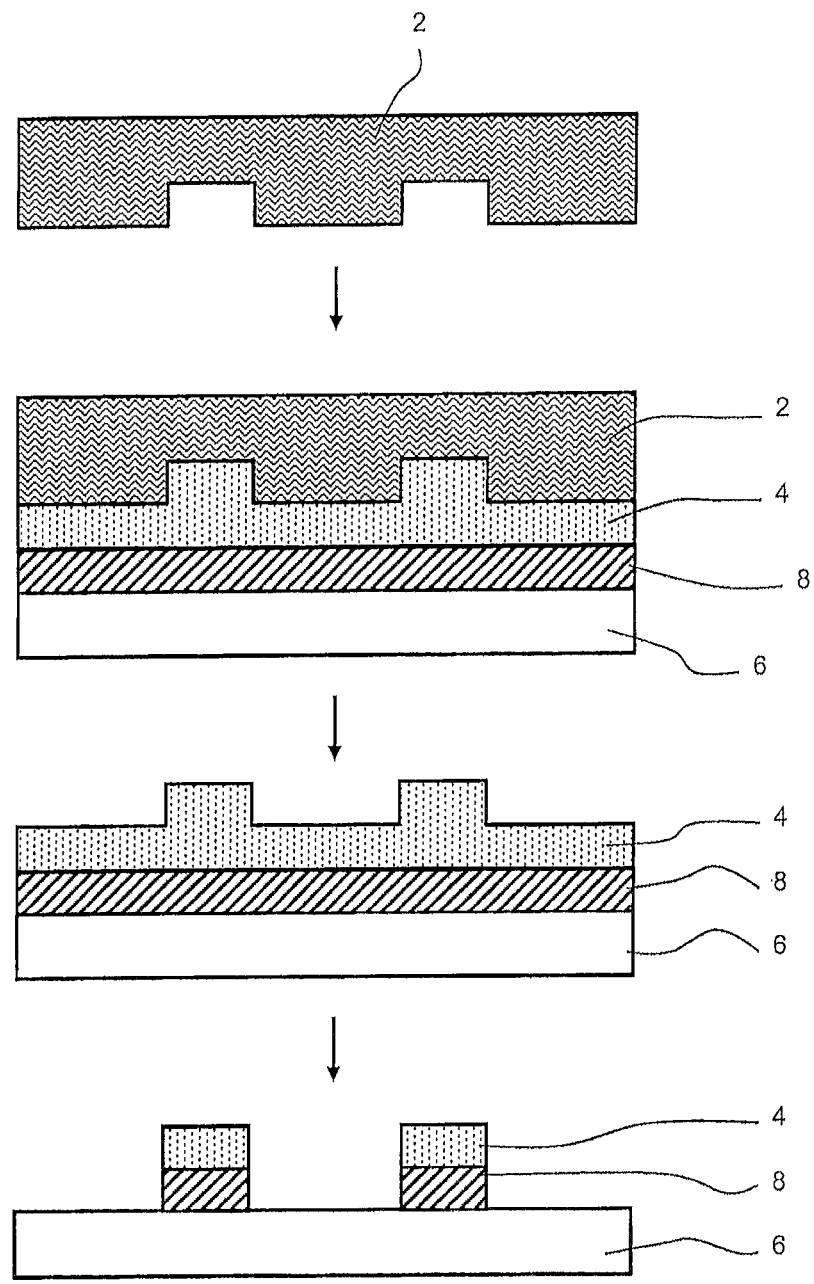
FIGS. 1a and 1b schematically depict examples of, respectively, hot imprint, and UV imprint lithography.
Figure 1B:
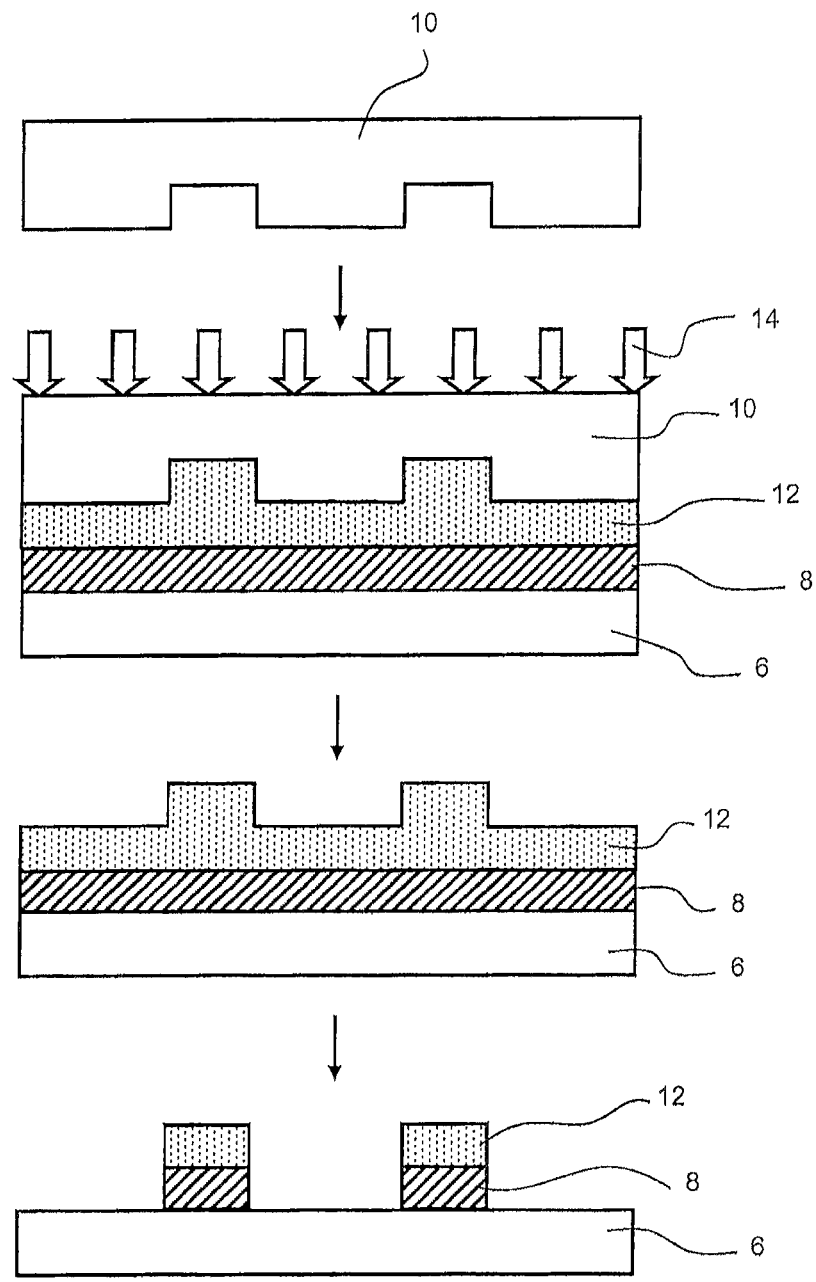

Examples of two approaches to imprint lithography are schematically depicted in FIGS. 1a to 1b.

FIG. 1a shows an example of so-called hot imprint lithography (or hot embossing). In a typical hot imprint process, an imprint template 2 is imprinted into a thermosetting or a thermoplastic imprintable medium 4, which has been provided on the surface of a substrate 6. The imprintable medium 4 may be, for example, resin. The imprintable medium 4 may for instance be spin coated and baked onto the substrate surface or, as in the example illustrated, onto a planarization and transfer layer 8 of the substrate 6. When a thermosetting polymer resin 4 is used, the resin 4 is heated to a temperature such that, upon contact with the imprint template 2, the resin 4 is sufficiently flowable to flow into the pattern features defined on the imprint template 2. The temperature of the resin 4 is then increased to thermally cure (crosslink) the resin 4 so that it solidifies and irreversibly adopts the desired pattern. The imprint template 2 may then be removed and the patterned resin 4 cooled. In hot imprint lithography employing a layer of thermoplastic polymer resin 4, the thermoplastic resin is heated so that it is in a freely flowable state immediately prior to imprinting with the imprint template. It may be necessary to heat thermoplastic resin to a temperature considerably above the glass transition temperature of the resin. The imprint template is contact with the flowable resin and then the resin is cooled to below its glass transition temperature with the imprint template in place to harden the pattern. Thereafter, the template is removed. The pattern will consist of the features in relief from a residual layer of the resin which may then be removed by an appropriate etch process to leave only the pattern features. Examples of thermoplastic polymer resins used in hot imprint lithography processes are poly(methyl methacrylate), polystyrene, poly (benzyl methacrylate) or poly(cyclohexyl methacrylate). For more information on hot imprint, see e.g. U.S. Pat. No. 4,731, 155 and U.S. Pat. No. 5,772,905.

FIG. 1b shows an example of UV imprint lithography, which involves the use of a transparent or translucent imprint template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than the thermosetting and thermoplastic resins used in hot imprint lithography and consequently may move much faster to fill imprint template pattern features. A quartz template 10 is applied to a UV-curable imprintable medium 12 in a similar manner to the process of FIG. 1a. However, instead of using heat or temperature cycling as in hot imprint lithography, the pattern is frozen by curing the imprintable medium 12 with UV radiation 14 that is applied through the quartz imprint template 10 onto the imprintable medium 12. After removal of the imprint template 10, the imprintable medium 12 is etched (and/or undergoes other further processing) to, for example provide pattern features in the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. US 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are also possible. See, e.g., U.S. Patent Application Publication No. US 2005-0274693, which mentions a combination of heating and UV curing an imprintable medium.

Figure 2A:
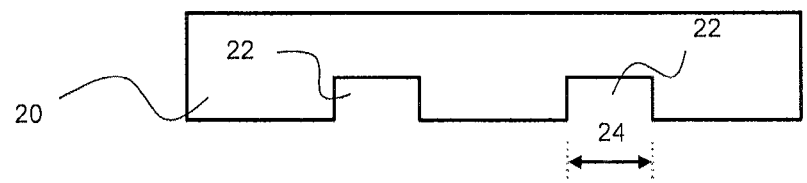
FIG. 2a schematically depicts an imprint template having pattern features with intended dimensions.

FIG. 2a schematically depicts an imprint template 20. The imprint template 20 is provided with recesses 22 which form pattern features which can be imprinted into, and used to form pattern features in, an imprintable medium, as described above. The recesses 22 may have a width 24 (or another dimension) which is as intended when the imprint template 20 was designed and then constructed.

During the construction of an imprint template, it is possible that pattern features such as recesses or protrusions have dimensions which are not as intended in the design of the imprint template. For instance, the pattern features of the imprint template may have a uniformity profile which varies across the imprint template. Such variation of uniformity of dimensions of pattern features may arise, for example, due to a variation in the processing conditions used to manufacture the imprint template. For instance, such variation in processing conditions may be due to a local variation or the like in a plasma concentration or density, or an e-beam writing error, or the like.

Figure 2B:
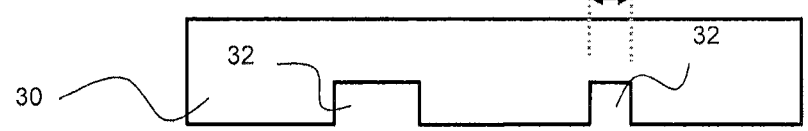
FIG. 2b schematically depicts an imprint template having pattern features with actual dimensions that differ from the intended dimensions.

FIG. 2b schematically depicts an imprint template 30 provided with recesses 32. Due to a non-uniformity in the manufacturing process used to manufacture the imprint template 30, one or more of the recesses 32 may have a width 34 which is smaller than intended (e.g. smaller than the width of the recesses shown in and described with reference to FIG. 2a).

If the imprint template 30 has one or more recesses 32 (or one or more other pattern features) which have dimensions that are not as intended, one or more pattern features provided on a substrate using the imprint template 30 will also have dimensions that are not as intended.

Figure 3:
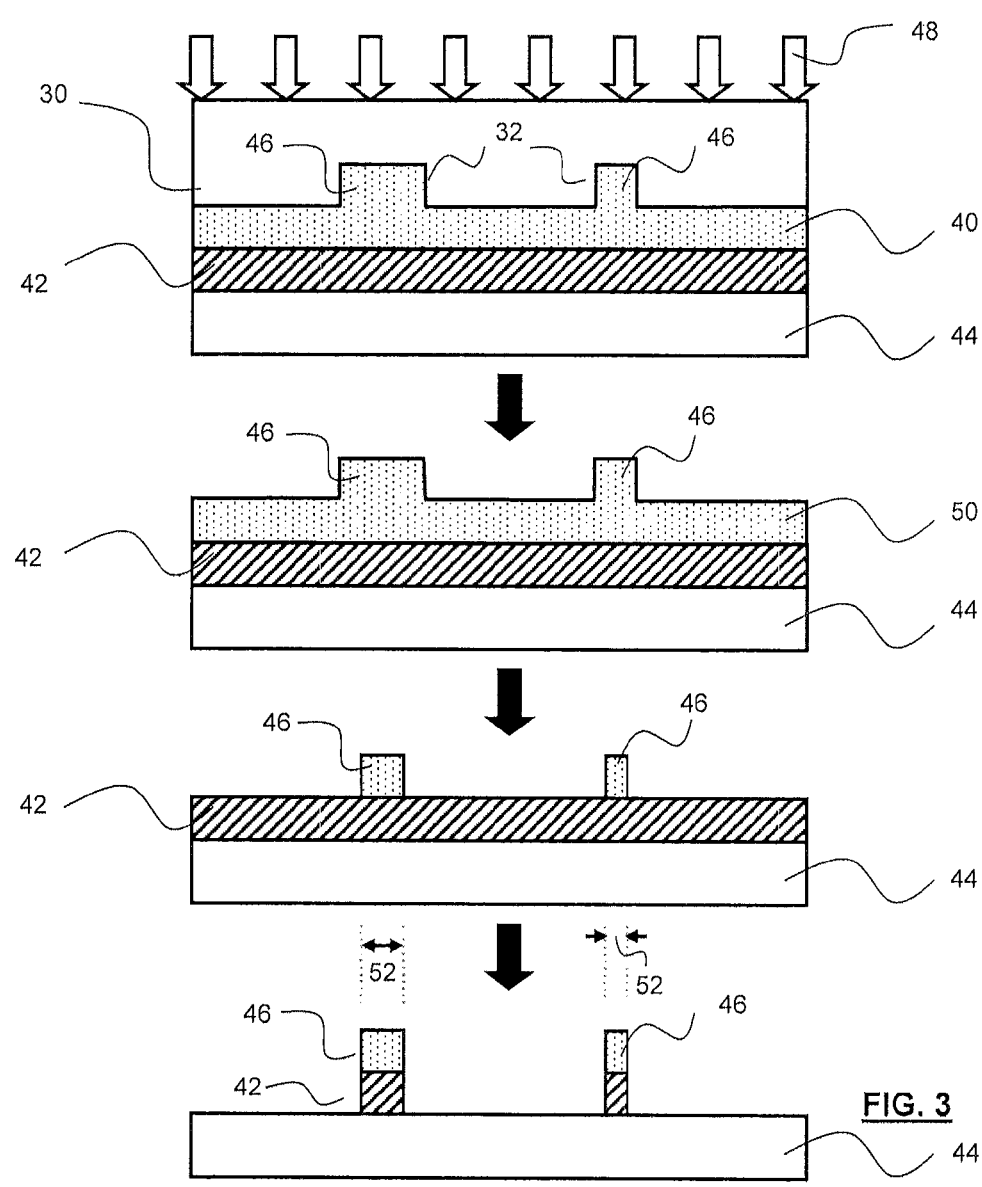
FIG. 3 schematically depicts an imprint lithography process using the imprint template shown in and described with reference to FIG. 2b.

FIG. 3 schematically depicts an example imprint lithography method using the imprint template 30 of FIG. 2b. In a first part of the method, the imprint template 30 is imprinted into a layer of imprintable medium 40. The layer of imprintable medium 40 is provided on a planarization and transfer layer 42 provided on substrate 44. Imprintable medium forms pattern features 46 by flowing into and filling recesses 32 of the imprint template 30. Actinic radiation 48 is used to irradiate and fix the imprintable medium 40 and thus the pattern features 46.

In a next step of the method, the imprint template 30 is released from the imprintable medium, and leaves pattern features 46 and a residual layer 50 of imprintable medium.

In a next step of the method, a breakthrough etch is undertaken to remove the residual layer of the imprintable medium and leave only the pattern features 46 on the planarization and transfer layer 42. The width of the pattern features 46 is reduced during the etch, for example by a few percent or less (exaggerated in the Figure for clarity).

In a next step of the method, a transfer etch is undertaken to remove parts of the planarization and transfer layer 42 not covered by the pattern features 46. Widths 52 of the pattern features 46 correspond to the widths of the recesses 32 of the imprint template 30 used to provide those pattern features 46, as would be expected.

From a review of FIG. 3, it will be appreciated that despite there being an intention to provide pattern features on a substrate having uniform widths (in this example), the widths of the resultant pattern features are in fact not uniform. This is due to a non-uniformity in the width of a recess or protrusion in the imprint template used to provide those pattern features (i.e. the width does not conform to the intended width). It is desirable to reduce or eliminate the occurrence of such non-uniformity in dimensions of pattern features provided on a substrate.

It will be appreciated that the use of the term "non-uniformity" is intended to encompass the situation where a dimension of a pattern feature provided on the substrate does not conform to or with an intended dimension of the pattern feature—i.e. the actual dimension does not conform to or with an intended dimension due to a non-uniformity in, for example, the manufacture of the imprint template. Thus, the term "non-uniformity" encompasses a non-conformity.

One or more problems or disadvantages associated with the art, whether identified herein or elsewhere, can be obviated or mitigated using an imprint lithography method according to an embodiment of the invention. According to an embodiment of the invention, there is provided an imprint lithography method. The imprint lithography method comprises providing a first amount of imprintable medium on a first area of a substrate. A second amount of imprintable medium is provided on a second, different area of a substrate. The first amount of imprintable medium, when fixed (e.g. by exposure to radiation, or by heating, or cooling, or by evaporation of a solvent, or the like) has a first etch rate. The second amount of imprintable medium, when fixed (e.g. by exposure to radiation, or by heating or by cooling, or by evaporation of a solvent, or the like) has a second, different etch rate. By providing different areas with amounts of imprintable medium having different etch rates, a non-uniformity in the dimension of a pattern feature of an imprint template, for example, can be compensated for during the etch stage of an imprint lithography method.

For an area of the substrate onto which a part of an imprint template is to be imprinted, one or more of the following may be undertaken:

If a part of the imprint template for that area of the substrate has a dimension substantially as intended, that area of the substrate may be provided with an amount of imprintable medium (e.g. the first amount or second amount) having a normal (i.e. nominal) etch rate.

If a part of the imprint template for that area of the substrate has a dimension that is smaller than intended, that area of the substrate may be provided with an amount of imprintable medium having an etch rate that is lower than the normal etch rate. This means that, during an etch phase, less of the pattern feature formed from imprintable medium having the lower etch rate will be etched away in comparison with a pattern feature formed from imprintable medium having a normal etch rate. If the etch rates (and etch times) are appropriately chosen, this may result in a relative increase in the size of the pattern feature formed from imprintable medium having the lower etch rate after the etch, such that after the etch the pattern features have the same width, or the like. This effect may thus compensate for the unintended reduced pattern feature size in the imprint template.

If a part of the imprint template for that area of the substrate has a dimension that is larger or greater than intended, that area of the substrate may be provided with an amount of imprintable medium having an etch rate that is higher than the normal etch rate. This means that, during an etch phase, more of the pattern feature formed from imprintable medium having the higher etch rate will be etched away in comparison with a pattern feature formed from imprintable medium having a normal etch rate. If the etch rates (and etch times) are appropriately chosen, this may result in a relative decrease in the size of the pattern feature formed from imprintable medium having the higher etch rate after the etch, such that after the etch the pattern features have the same width, or the like. This effect may thus compensate for the unintended increased pattern feature size in the imprint template.

Specific embodiments of the invention will now be described, by way of example only, with reference to FIGS. 4 to 12. FIGS. 4 to 12 have not been drawn to any particular scale, and in FIGS. 4 to 12 like features have been given like reference numerals where appropriate.

Figure 4:
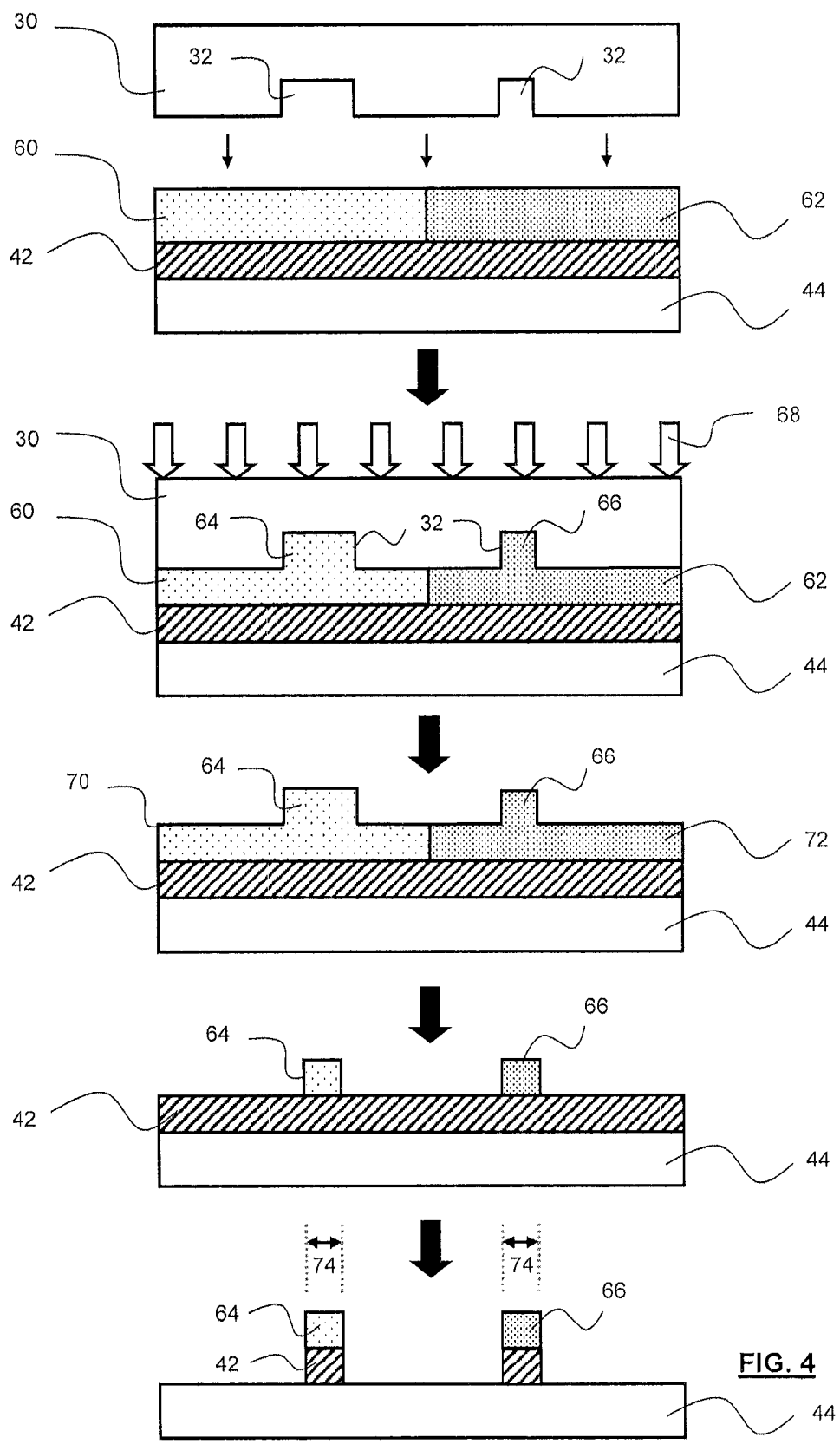
FIG. 4 schematically depicts an imprint lithography method according to an embodiment of the invention, in which different amounts of imprintable medium having different etch rates are provided on a substrate and then imprinted.

FIG. 4 schematically depicts an imprint lithography method according to an embodiment of the invention. In a first stage of the method, a substrate 44 provided with an (optional) planarization and transfer layer 42 is further provided with imprintable medium. A first amount of imprintable medium 60 is provided on a first area of the planarization and transfer layer 42. A second amount of imprintable medium 62 is provided on a second, different area of the planarization and transfer layer 42. The first amount of imprintable medium 60, when fixed (e.g. by exposure to actinic radiation, or by heating, or by cooling, or by evaporation of a solvent, or the like) has a first etch rate, and the second amount of imprintable medium 62, when fixed (e.g. by exposure to actinic radiation, or by cooling, or by heating, or by evaporation of a solvent, or the like), has a second, different etch rate.

A location, and/or extent (e.g. spatial extent, such as an area that is covered), and/or etch rate of the first amount of imprintable medium 60 and/or a location, and/or extent (e.g. spatial extent, such as an area that is covered), and/or etch rate of the second amount of imprintable medium 62 may be related to a property of an imprint template 30 that is to be used to imprint a pattern into the first amount of imprintable medium 60 and second amount of imprintable medium 62. For example, the property of the imprint template may be a uniformity profile of the imprint template, and for instance, a uniformity profile of one or more dimensions of, for example, recesses 32 or other pattern features of the imprint template 30.

For an area of the substrate 44 (with or without optional planarization and transfer layer 42) onto which a part of the imprint template 30 is to be imprinted, various options are available, as discussed above. For example, if the part of the imprint template 30 for that specific area of the substrate 44 has a dimension substantially as intended (e.g. one or more recess widths or one or more protrusion widths), that area of the substrate 44 is provided with an amount of imprintable medium having a normal or nominal etch rate. For instance, the first amount of imprintable medium 60, when fixed, may have a normal or nominal etch rate. This may be because a recess 32 to be imprinted into that first amount of imprintable medium 60 has a dimension as intended.

If a part of the imprint template 30 for that specific area of the substrate 44 has a dimension smaller than intended, that area of the substrate may be provided with an amount of imprintable medium having an etch rate that is lower than the normal etch rate. For example, the second amount of imprintable medium 62 may have, when fixed, an etch rate lower than the normal etch rate of the first amount of imprintable medium 60. This may be because a recess 32 that is to be imprinted into the second amount of imprintable medium 62 has a dimension which is smaller than intended.

If a part of the imprint template 30 for that specific area of the substrate 44 has a dimension larger than intended, that area of the substrate 44 may be provided with an amount of imprintable medium having an etch rate that is higher than the normal etch rate. For example, the second amount of imprintable medium 62 may have, when fixed, an etch rate higher than the normal etch rate of the first amount of imprintable medium 60. This may be because a recess 32 that is to be imprinted into the second amount of imprintable medium 62 has a dimension which is larger than intended.

When the first amount of imprintable medium 60 and second amount of imprintable medium 62 has been provided on the planarization and transfer layer 42, the imprint template 30 may be imprinted into the imprintable medium 60, 62 (e.g. simultaneously).

The first amount of imprintable medium 60 and second amount of imprintable medium 62 are located within a single imprint area, so that the imprint template 30 may be used to simultaneously imprint a pattern into the first amount of imprintable medium 60 and second amount of imprintable medium 62.

In the next stage of the method, the imprint template 30 has been imprinted into the first amount of imprintable medium 60 and second amount of imprintable medium 62. The first amount of imprintable medium 60 flows into recess 32 and forms a pattern feature 64 in that recess. At the substantially same time, the second amount of imprintable medium 62 flows into another recess 32, and forms a pattern feature 66 in that recess. The first amount of imprintable medium 60 and second amount of imprintable medium 62 is then exposed to actinic radiation 68 (e.g. UV radiation) to fix the first amount of imprintable medium 60 and second amount of imprintable medium 62. Alternatively or additionally, heating or cooling, or the evaporation of a solvent, could be used to change the state of the imprintable medium from a substantially fluid state to a substantially solid (i.e. fixed) state.

In the next stage of the method, the imprint template 30 is released from the first amount of imprintable medium 60 and second amount of imprintable medium 62 to leave the pattern features 64, 66 of imprintable mediums 60, 62 and residual layers 70, 72 of imprintable mediums 60, 62.

In the next stage of the method, a break through etch is undertaken to remove the residual layers, and leave only the pattern features 64, 66 residing on the planarization and transfer layer 42. Because the pattern feature 64 comprising the first amount of imprintable medium has a normal etch rate, the width of the pattern feature 64 is reduced during the etch, for example by a few percent or less (exaggerated in the Figure for clarity), as discussed in relation to FIG. 3. In contrast, the width of the pattern feature 66 comprising the second amount of imprintable medium is substantially the same after etching. This is because the second amount of imprintable medium has an etch rate which is lower than the normal etch rate of the first amount of the imprintable medium (i.e. the second amount of imprintable medium has a higher etch resistance).

In a final stage of the method, a transfer etch is undertaken to remove all areas of the planarization and transfer layer 42 that are not located beneath the pattern features 64, 66. The difference in etch rate between the first and second amount of imprintable medium forming the pattern features 64, 66 may again have an effect at this etch stage and may alternatively or additionally be used to ensure (or attempt to ensure) that at the end of the method the pattern features 64, 66 have intended widths.

By comparing the last stages of the methods shown in FIGS. 3 and 4, an advantage and benefit of an embodiment of the invention is clear. In the method according to an embodiment of the invention as shown in FIG. 4, the Widths of the pattern features are the same (for this particular example), and are as intended. This is due to the provision of different amounts of imprintable medium having different etch rates. This allows for the compensation of unintended non-uniformity in a dimension of one or more pattern features of the imprint template during a subsequent etch stage of pattern features provided in the imprintable medium by that imprint template. In comparison, in the method shown in FIG. 3, the widths of the pattern features on the substrate are not the same, and are not as intended. This is due to the provision of imprintable medium having a single etch rate. There is no potential to compensate for non-uniformity in the dimension of one or more pattern features of the imprint template during a subsequent etch stage of pattern features provided in the imprintable medium by that imprint template.

It will be understood that features cannot be made larger during an etch phase, even if the etch rate of imprintable medium is lower than a nominal etch rate. Thus, in order to compensate for a pattern feature in the imprint template that is smaller than intended, and to help ensure that all pattern features have, for example, the substantially same critical dimension, the critical dimension being determined by the smaller than intended pattern feature on the imprint template. One way of overcoming this problem would be to choose a nominal critical dimension for pattern features to be provided on the substrate that is smaller than the critical dimensions of features on the imprint template. In practice, this can be achieved by always over-etching the imprintable medium after imprinting, to reduce the feature size. Imprintable medium having a nominal etch rate will thus have a nominal (and intended) feature size after etching. Imprintable medium having a lower etch rate (i.e. a higher etch resistance) will have a feature size which increases, relative to features formed from imprintable medium with a nominal etch rate. The lower etch rate can be chosen to ensure that the relative increase helps ensure that the resultant feature size is nominal, and as intended, and thus helping to ensure that all features after the etch have the same nominal critical dimension.

In another example, not shown, it may be desirable to compensate for a pattern feature in an imprint template which has a width that is greater than intended. In order to compensate for this, the amount of imprintable medium into which the larger than intended pattern feature is imprinted may have an etch rate that is higher (i.e. have a lower etch resistance) in order to help ensure that, after an etch, the corresponding pattern feature provided in the imprintable medium by the imprint template has a width that is as intended.

The etch rates of the different amounts of imprintable medium may be chosen, set, selected or the like in any one of a number of different ways. In general, the first etch rate of the first amount of imprintable medium may be different from the second etch rate of the second amount of imprintable medium due to a difference in an amount of etch resistant material in the first amount of imprintable medium and the second amount of imprintable medium. The etch resistant material may be, for example, a silicon containing monomer or dimer. In one example, the first amount of imprintable medium may be provided by the provision of a first component and the provision of a second component, an amount of the second component dictating the etch rate of the first amount of imprintable medium when fixed. Similarly, the second amount of imprintable medium may be provided by the provision of a first component and a provision of a second component, an amount of the second component dictating the etch rate of the second amount of imprintable medium when fixed. For instance, the second component could be the etch resistant material. The amount of the second component could be different for different areas of the substrate, for example, to take into account a uniformity profile of an imprint template to be imprinted onto the substrate. The different areas may be within, or extend across, a single die or target area or single imprintable area of the substrate. The amount of the second component may be increased for successive imprints on a substrate, or decreased for successive imprints on a substrate. In another example, the amount of the second component may be increased successively for all of the imprints on a substrate, and then decreased successively for all of the imprints on a second substrate. The continuous increase or decrease in the amount of the second component may make it easier to provide the second component, or make it quicker for the imprints to be undertaken, since less time will be needed to, for example, mix or provide the first and second components in different quantities for different areas of the substrate.

In an further example, the first amount of imprintable medium may be provided by the provision of a first component that, when fixed, has a first etch rate, and a second component that, when fixed, has a second, different etch rate, a ratio of the first to second component dictating the overall etch rate of the first amount of an imprintable medium. Similarly, the second amount of imprintable medium may be provided by the provision of a first component that, when fixed, has a first etch rate, and a second component that, when fixed, has a second, different etch rate, a ratio of the first to second component dictating the overall etch rate of the second amount of imprintable medium. The first or second etch rate may be zero. By controlling, or selecting, or the like the amounts of the first and second components in the first and/or second amounts of imprintable medium, the etch rates of the imprintable medium can be controlled. The ratios, and thus the etch rates, may be different for different areas of the substrate. As with the previous embodiment, the ratios may be increased for successive imprints on the substrate, or decreased for successive imprints on the substrate. For instance, the ratio may be increased successively for imprints on a single substrate, and then decreased successively for imprints on a second, different substrate. This may make it easier and/or quicker to provide the required ratio, and/or the increase or decrease in the ratio.

In any of the previous embodiments, the first and second components may be provided together. For instance, the first and second components may be pre-mixed and dispensed at the same time, for example, in a single body of material or the like. In another example, the first and second components may be provided separately. For example, the components may be provided from different component sources and then mixed immediately prior to the provision of the two components on the substrate, mixed during the provision of the components on the substrate, or mixed on the substrate. The components may be mixed on the substrate by, for example, successive deposition of the components on top of one another, or adjacent to one another in order for the components to coalesce and mix.

The first amount of imprintable medium and/or second amount of imprintable medium (and any components thereof) may be provided in a liquid form, and then subsequently fixed by exposure to radiation, or by heating, or by cooling, or by evaporation of a solvent.

The first amount of imprintable medium and/or second amount of imprintable medium (and any components thereof) may be provided in the form of one or more droplets. This may make it easier to provide one or more components in one or more of the same or different locations, thus making it possible to ensure that the locations, and/or areas, and/or extents (e.g. spatial extents, such as areas that are covered), of the first amount of imprintable medium and/or second amount of imprintable medium are consistently and/or accurately provided on the substrate.

A chemical composition of the first and/or second component of the first amount of imprintable medium may differ from a chemical composition of the first and/or second component of the second amount of imprintable medium. The first amount of imprintable medium and second amount of imprintable medium may be the same or different in volume, and/or the surface area of the substrate covered. The first and second amounts are different in terms of etch rates, and not necessarily volume or surface area covered.

Although first and second amounts of imprintable medium have been described, more than two amounts or imprintable medium may be provided on a substrate. For example, three, four, five or more different amounts of imprintable medium having different respective etch rates may be provided on the substrate in order to take into account, for example, a profile (e.g. a uniformity profile) of one or more pattern features or the like of an imprint template to be imprinted into imprintable medium provided on different areas of a substrate.

Figure 5:
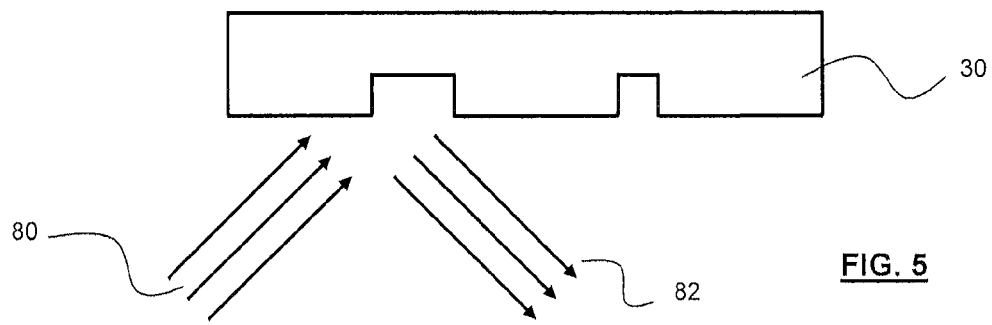
FIG. 5 schematically depicts a method of inspection of the pattern features of an imprint template.

In order to be able to determine a certain location, and/or extent (e.g. spatial extent, such as an area that is covered), and/or etch rate of the first and/or second (or more) amounts of imprintable medium, it may be desirable to inspect the imprint template. Inspection of the imprint template may be undertaken to, for example, determine a property of an imprint template, for example, a uniformity profile of the imprint template which may include a variation in one or more dimensions of one or more pattern features created during the manufacture of the imprint template. FIG. 5 schematically depicts an imprint template 30. Inspection of the imprint template may be undertaken by directing radiation 80 at the imprint template 30, and in particular at one or more pattern features of the imprint template 30, and then detecting radiation 82 re-directed (e.g. by scattering or by reflection or the like) by the imprint template 30. For example, one or more intensity distributions, or change in those intensity distributions may be related to a dimension or a change in dimension of one or more pattern features of the imprint template 30, from which a profile of the dimension or change in the dimension may be established.

In a further example, another apparatus or method could be used to inspect the imprint template, for example using scanning electron microscopy or the like. Alternatively or additionally, a substrate that has been imprinted with an imprint template could be inspected in order to be able to determine a certain location, and/or extent (e.g. spatial extent, such as an area that is covered), and/or etch rate of the first and/or second (or more) amounts of imprintable medium used in a subsequent imprint. This may allow unintended non-uniformity in the imprint template to be determined, as well as non-uniformity in the processing of one or more pattern features on the substrate after the imprint.

Once inspection of the imprint template 30 and/or an imprinted substrate has been undertaken, the first and second (or more) amounts of imprintable medium may be provided on a substrate, thus making the substrate ready for imprinting with the imprint template 30. FIGS. 6 to 9 schematically depict how different amounts of imprintable medium may be provided on such a substrate.

Figure 6:
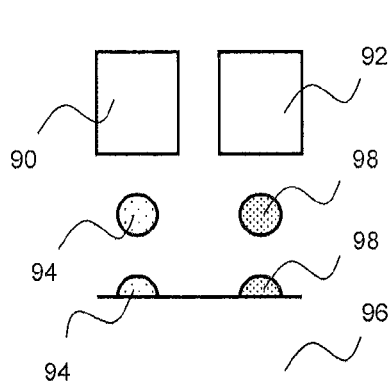
FIG. 6 schematically depicts an apparatus configured to dispense a first amount of imprintable medium on a substrate, and a second amount of imprintable medium on a substrate, according to an embodiment of the invention.

FIG. 6 schematically depicts a first imprintable medium dispenser 90 and a second imprintable medium dispenser 92. In FIG. 6, as well as in any one or more of FIGS. 7 to 9, an imprintable medium dispenser may be, for example, a print head or a nozzle or any other suitable dispenser.

The first imprintable medium dispenser 90 dispenses a first amount of imprintable medium 94 on to a substrate 96. The second imprintable medium dispenser 92 dispenses a second amount of imprintable medium 98 on a second different area of the substrate, for example, an area that is adjacent to the area on which the first amount of imprintable medium 94 was, or is dispensed. The first amount of imprintable medium 94 may be provided in parallel with the provision of the second amount of imprintable medium 98, or the first and second amounts 94, 98 may be provided at different times, for example in series.

Figure 7:
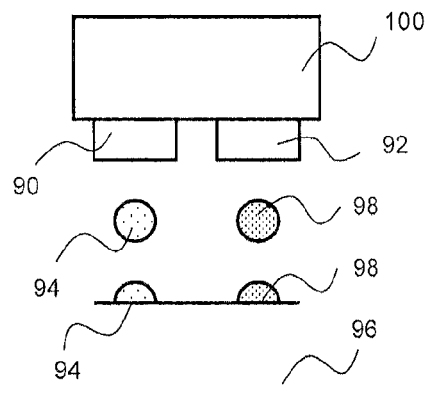
FIG. 7 schematically depicts an apparatus configured to provide a first amount of imprintable medium on a substrate, and a second amount of imprintable medium on a substrate, according to a further embodiment of the invention.

FIG. 7 schematically depicts a similar dispensing arrangement to that shown in and described with reference to FIG. 6. However, in FIG. 7, the first imprintable medium dispenser 90 and second imprintable medium dispenser 92 form part of a dispensing configuration 100, which may be, for example, a print head or the like. The dispensing configuration 100 may, for example, store or provide the different amounts of imprintable medium 94, 98, or sub-components of the different amounts of imprintable medium 94, 98 to the first and/or second dispensers 90, 92.

Figure 8A:
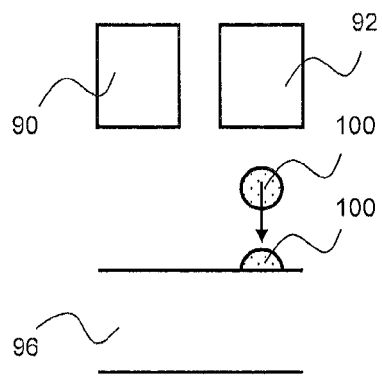
FIGS. 8a and 8b schematically depict the provision of imprintable medium on a substrate according to a further embodiment of the invention.
Figure 8B:
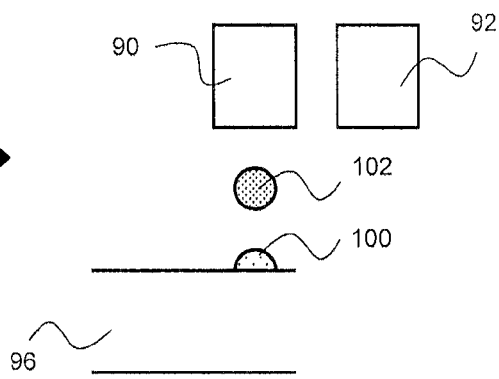

FIG. 8a shows that a second imprintable medium dispenser 92 may be configured to provide a first imprintable medium component 101 on a substrate 96. FIG. 8b shows that a first imprintable medium dispenser 90 may be configured to provide a second imprintable medium component 102 on substantially the same location as the previously provided first imprintable medium component 101. The first and second components 101, 102 will coalesce, or merge, or mix or the like, thus forming the first and/or second amount of imprintable medium on the substrate. One or both of the first and/or second components 101, 102 may determine the overall etch rate of the amount of imprintable medium provided on the substrate. In one example, the first and/or second components 101, 102 may have different etch rates, and the overall etch rate of the combined components may be determined by the ratio of the components 101, 102. In another example, one of the components 101, 102 may determine the etch rate of the combined components. For instance, an increased amount of etch resistant material in or forming a first or second component 101, 102 may determine the etch rate of the combined components as a whole. In one example, the ratios of the first to second components may be different for different areas of the substrate to provide different areas of the substrate with an amount of imprintable medium having different etch rates. Alternatively, or additionally, more or less etch resistant material may be added to other components in different areas of the substrate to provide amounts of imprintable medium on different areas of the substrate which have different etch rates.

Figures 9A, 9B:
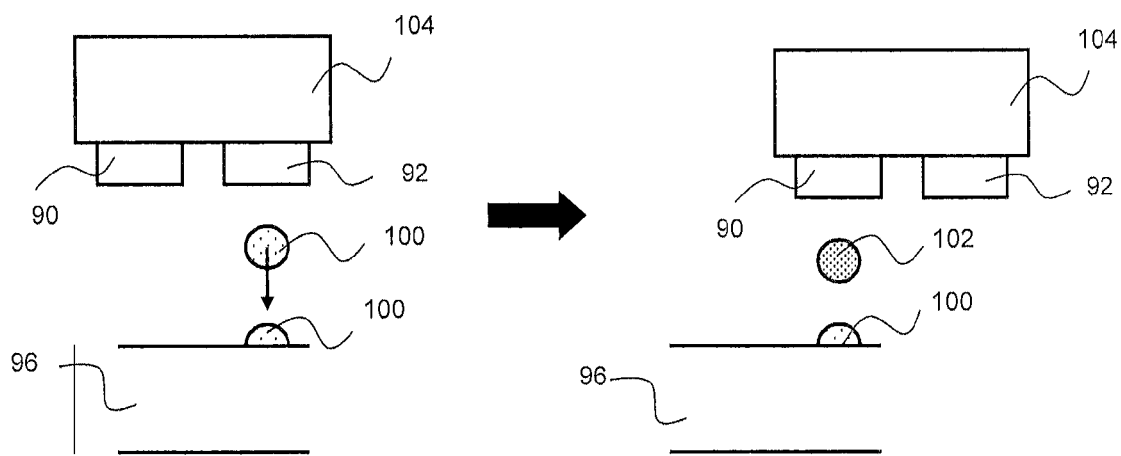
FIGS. 9a and 9b schematically depict the provision of imprintable medium on a substrate according to a further embodiment of the invention.

FIGS. 9a and 9b depicts substantially the same imprintable medium dispensing arrangement as shown in FIGS. 8a and 8b. However, in FIGS. 9a and 9b, the imprintable medium dispensers 90, 92 form part of a dispensing configuration 104, which may be, for example, a print head or the like. The dispensing configuration 104 may, for example, store or provide the different imprintable medium components 101, 102 of the different amounts of imprintable medium to the first and/or second dispensers 90, 92.

The one or more imprintable medium dispensers may be provided with first and second amounts of imprintable medium in independent form, or in a combined form, the combined form having the desired etch rate. If more than one component is to be provided to form the first or second amount of imprintable medium on the substrate, the first and second components could be mixed in the imprintable medium dispenser, or on the substrate by, for example, the provision of the first and second components on substantially the same area of the substrate.

Figure 10:
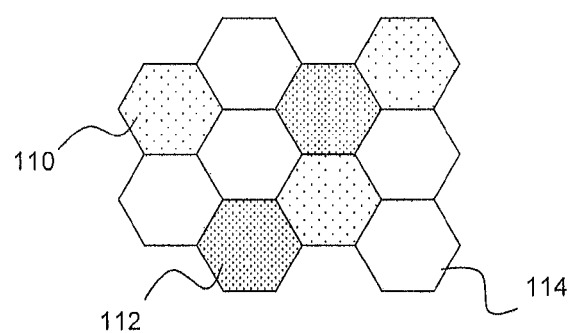
FIG. 10 schematically depicts different amounts of imprintable medium, each having different etch rates, provided on a substrate in accordance with an embodiment of the invention.

FIG. 10 is a plan view schematically depicting first, second and third amounts of imprintable medium, 110, 112, 114 provided on a substrate. The first, second and third amounts of imprintable medium 110, 112, 114 have different etch rates in order to take into account (i.e. compensate for), for example, a uniformity profile of an imprint template to be imprinted into the first, second and third amounts of imprintable medium 110, 112, 114. The amounts of imprintable medium 110, 112, 114 may be provided in any convenient manner, for example, in one or more of the methods, or using one or more of the apparatus, described herein.

The methods according to embodiments of the invention may be implemented by an imprint lithography apparatus, according to an embodiment of the invention. The apparatus may, for example, comprise one or more imprintable medium dispensers, such as those discussed above in relation to FIGS. 6 to 9. A controller is provided to control the one or more imprintable medium dispensers. The controller may be a computational device such as a computer or the like, or may be an embedded processor or other suitable apparatus for controlling the one or more imprintable medium dispensers. The controller is arranged (e.g. programmed or configured) to control the one or more imprintable medium dispensers in order to: provide a first amount of imprintable medium on a first area of a substrate onto which a pattern is to be imprinted; and provide a second amount of imprintable medium on a second, different area of the substrate. The first amount of imprintable medium, when fixed, has a first etch rate, and the second amount of imprintable medium, when fixed, has a second, different etch rate, as discussed above.

The controller can be provided with information, or obtain information, that is at least indicative of the dimension of one or more pattern features of an imprint template to be used in an imprint lithography method. For an area of the substrate onto which a part of an imprint template is to be imprinted, one or more of the following may then be undertaken: if the part of the imprint template for that area of the substrate has one or more dimensions substantially as intended, the controller may control the one or more imprintable medium dispensers to ensure that the area of the substrate is provided with an amount of imprintable medium having a normal etch rate; and/or if a part of the imprint template for that area of the substrate has one or more dimensions smaller than intended, the controller may control the one or more imprintable medium dispensers to ensure that the area of the substrate is provided with an amount of imprintable medium having an etch rate that is lower than the normal etch rate; and/or if a part of the imprint template for that area of the substrate has one or more dimensions larger than intended, the controller may control the one or more imprintable medium dispensers to ensure that the area of the substrate is provided with an amount of imprintable medium having an etch rate that is higher than the normal etch rate.

In addition to the choosing of desired etch rates, it will be appreciated that there will be desired and corresponding etch times, the etch rates and etch times together forming part of an etch process.

It will be appreciated that the use of the term "non-uniformity" is intended to encompass the situation where a dimension of a pattern feature provided on the substrate does not conform to or with an intended dimension of the pattern feature—i.e. the actual dimension does not conform to or with an intended dimension due to a non-uniformity in, for example, the manufacture of the imprint template. The non-conformity can arise due to a non-uniformity of the manufacture of the imprint template (as discussed above), or due to a subsequent processing of the pattern feature provided on the substrate. For example, it may be known from one or more trials or other experiments that, after imprinting, processing of the pattern feature is not as intended, leading to a change (or further change) in a dimension of a pattern feature from an intended pattern feature. Thus, alternatively or additionally, a location, and/or extent (e.g. spatial extent, such as an area that is covered), and/or etch rate of the first amount of imprintable medium, and/or a location, and/or extent (e.g. spatial extent, such as an area that is covered), and/or etch rate of the second amount of imprintable medium, is related to a property of processing of one or more pattern features that have been provided on the substrate. The property may be a bake or etch profile of a subsequent process, for example a uniformity profile of the process (e.g. an actual property as opposed to an intended property), which may correspond to pattern features on the substrate having a dimension that was not intended (i.e. that does no conform to an intended dimension). The profile may be at least indicative of how a dimension (e.g. a width or length) of one or more pattern features on the template would otherwise differ from an intended dimension. Thus, in addition or in the alternative to compensating for non-uniformity of the imprint template, for an area of the substrate onto which a part of an imprint template is to be imprinted, one or more of the following may be undertaken:

if the processing of pattern features provided by that imprint would result in pattern features on that area of the substrate having dimensions being substantially as intended, that area of the substrate is provided with an amount of imprintable medium having a normal etch rate; and/or if the processing of pattern features provided by that imprint would result in pattern features on that area of the substrate having dimensions being smaller than intended, that area of the substrate is provided with an amount of imprintable medium having an etch rate that is lower than the normal etch rate; and/or if the processing of pattern features provided by that imprint would result in pattern features on that area of the substrate having dimensions being larger than intended, that area of the substrate is provided with an amount of imprintable medium having an etch rate that is higher than the normal etch rate.

Figure 11:
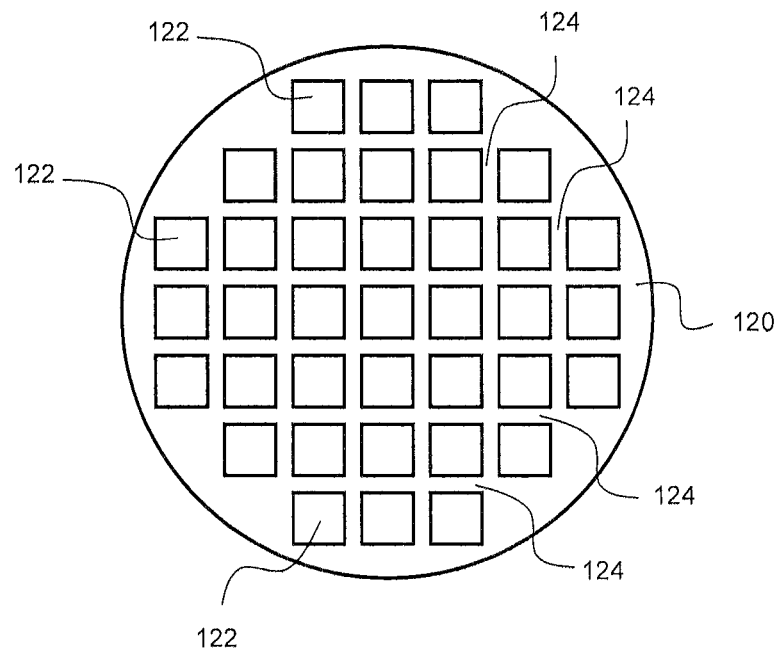
FIG. 11 schematically depicts a plan view of a substrate, together with target locations of areas to be imprinted with an imprint template.

FIG. 11 schematically depicts a plan view of a substrate 120. Depicted on the substrate 120 is a plurality of target areas 122 onto which, in use, an imprint template is to be imprinted. The target areas 122 may be, for example, dies. In-between the target areas 122 are areas known as streets or lanes 124. After the substrate 120 has been processed to form, for example, one or more devices on the one or more target areas 122, the streets or lanes 124 may conveniently be used as areas through which a cutting device or tool may be passed to physically separate the target areas (e.g. dies) from one another to form devices or the like. The streets or lanes 124 may be or comprise scribes lines, or the like.

When providing imprintable medium on a substrate, it is known to provide the imprintable medium directly onto the target areas 122 of the substrate referred to above. However, when an imprintable medium dispenser is initially operated, the nature of imprintable medium dispensed may be different from when the imprintable medium dispenser has been operating for a longer period of time (e.g. when the imprintable medium dispenser has reached a steady state or the like). For instance, the first amounts (e.g. droplets) of imprintable medium dispensed may have a different chemical composition or volume to amounts dispensed at a later time, for example, due to the change in chemical composition of imprintable medium in one or more dispensing outlets or nozzles of the imprintable medium dispenser. When providing an amount of imprintable medium on a substrate (e.g. a first or second amount) it is desirable to avoid any difference in the composition of the particular amount of imprintable medium, in order to eliminate or reduce any defects in pattern features as a result of such differences.

The problems referred to above may be obviated or mitigated by ensuring that prior to dispensing imprintable medium onto a target area of a substrate, imprintable medium is first dispensed onto a non-critical area of the substrate (i.e. not a target area), for example onto a street or lane of a substrate. Alternatively or additionally, the problems referred to above may be obviated or mitigated by ensuring that prior to dispensing imprintable medium onto a target area of a substrate, imprintable medium is first dispensed away from (i.e. not onto) the substrate.

Figure 12:
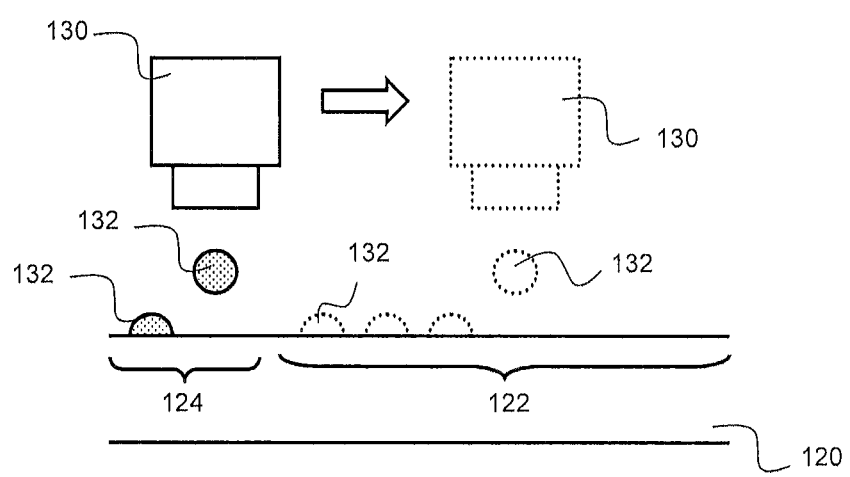
FIG. 12 schematically depicts the provision of an amount of imprintable medium outside of an area to be imprinted with an imprint template, before the provision of imprintable medium on the area to be imprinted with an imprint template, in accordance with an embodiment of the invention.

FIG. 12 schematically depicts an imprintable medium dispenser 130 dispensing imprintable medium 132 onto a street or lane 124 of a substrate 120. Subsequently, and as shown in dotted-outline in FIG. 12, the imprintable medium dispenser 130 dispenses imprintable medium 132 onto a target area 122 of the substrate 120 (after the substrate 120 has been displaced relative to the imprintable medium dispenser 130 and/or the imprintable medium dispenser 130 has been displaced relative to the substrate 120). The amount of imprintable medium 132 dispensed on the streets or lanes 124 can be chosen to ensure that by the time imprintable medium is dispensed on the target areas 122 of the substrate, the imprintable medium 132 has a uniform composition or droplet size or the like.

In an embodiment, there is provided an imprint lithography method comprising: providing a first amount of imprintable medium on a first area of a substrate, the first amount of imprintable medium, when fixed, having a first etch rate; and providing a second amount of imprintable medium on a second, different area of the substrate, the second amount of imprintable medium, when fixed, having a second, different etch rate.

In an embodiment, a location, and/or extent, and/or etch rate of the first amount of imprintable medium, and/or a location, and/or extent, and/or etch rate of the second amount of imprintable medium, is related to a property of an imprint template that is to be used to imprint a pattern into the first amount of imprintable medium and second amount of imprintable medium, and/or is related to a process undertaken on pattern features provided in the first and second amounts of imprintable medium after the imprint template has been imprinted into the first and second amounts of imprintable medium. In an embodiment, the property is a uniformity profile of the imprint template and/or the process. In an embodiment, for an area of the substrate onto which a part of an imprint template is to be imprinted, one or more of the following is undertaken: if the part of the imprint template for that area of the substrate has a dimension substantially as intended, that area of the substrate is provided with an amount of imprintable medium having a normal etch rate; and/or if a part of the imprint template for that area of the substrate has a dimension smaller than intended, that area of the substrate is provided with an amount of imprintable medium having an etch rate that is lower than the normal etch rate; and/or if a part of the imprint template for that area of the substrate has a dimension larger than intended, that area of the substrate is provided with an amount of imprintable medium having an etch rate that is higher than the normal etch rate. In an embodiment, for an area of the substrate onto which a part of an imprint template is to be imprinted, one or more of the following is undertaken: if the processing of pattern features provided by that imprint would result in a pattern feature on that area of the substrate having a dimension being substantially as intended, that area of the substrate is provided with an amount of imprintable medium having a normal etch rate; and/or if the processing of pattern features provided by that imprint would result in a pattern feature on that area of the substrate having a dimension being smaller than intended, that area of the substrate is provided with an amount of imprintable medium having an etch rate that is lower than the normal etch rate; and/or if the processing of pattern features provided by that imprint would result in a pattern feature on that area of the substrate having a dimension being larger than intended, that area of the substrate is provided with an amount of imprintable medium having an etch rate that is higher than the normal etch rate. In an embodiment, the first etch rate is different from the second etch rate due to a difference in an amount of etch resistant material in the first amount of imprintable medium and the second amount of imprintable medium. In an embodiment, the first amount of imprintable medium is provided by the provision of a first component and the provision of a second component, an amount of the second component dictating the etch rate of the first amount of imprintable medium when fixed; and/or the second amount of imprintable medium is provided by the provision of a first component and the provision of a second component, an amount of the second component dictating the etch rate of the second amount of imprintable medium when fixed. In an embodiment, the amount of the second component is different for different areas of the substrate. In an embodiment, the amount of the second component is increased for successive imprints on the substrate, or decreased for successive imprints on the substrate. In an embodiment, the first and second components are provided together. In an embodiment, the first and second components are provided separately. In an embodiment, the first amount of imprintable medium is provided by the provision of a first component that, when fixed, has a first etch rate, and a second component that, when fixed, has a second, different etch rate, a ratio of the first to second component dictating the overall etch rate of the first amount of imprintable medium; and/or the second amount of imprintable medium is provided by the provision of a first component that, when fixed, has a first etch rate, and a second component that, when fixed, has a second, different etch rate, a ratio of the first to second component dictating the overall etch rate of the second amount of imprintable medium. In an embodiment, the ratio is different for different areas of the substrate. In an embodiment, the ratio is increased for successive imprints on the substrate, or decreased for successive imprints on the substrate. In an embodiment, the first amount of imprintable medium, and/or the second amount of imprintable medium, is provided in a liquid form, and then subsequently fixed by exposure to radiation, or by heating, or by cooling, or by evaporation of a solvent. In an embodiment, the first amount of imprintable medium, and/or the second amount of imprintable medium, is provided in the form of one or more droplets.

In an embodiment, there is provided an imprint lithography apparatus, comprising: an imprintable medium dispenser; a controller configured to control the imprintable medium dispenser, the controller configured to control the imprintable medium dispenser in order to: provide a first amount of imprintable medium on a first area of a substrate onto which a pattern is to be imprinted, the first amount of imprintable medium, when fixed, having a first etch rate; and provide a second amount of imprintable medium on a second, different area of the substrate, the second amount of imprintable medium, when fixed, having a second, different etch rate.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements. In an embodiment, there is provided an apparatus configured to use one template holder arrangement per substrate holder. In an embodiment, there is provided an apparatus configured to use more than one template holder arrangement per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more detectors and/or detection arrangements referred to herein may be operable when the one or more computer programs are read by one or more computer processors located within at least one component of the dispenser and/or dispensing configuration or located in some other component that interoperates with the dispenser and/or dispensing configuration.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography apparatus, comprising:
an imprintable medium dispenser;
a control system, the control system configured to control the imprintable medium dispenser in order to:
provide a first amount of imprintable medium for nanoimprint lithography on a first area of a substrate onto which a pattern is to be imprinted, the first amount of imprintable medium, when fixed, having a first etch rate as a physical characteristic thereof, and
provide a second amount of imprintable medium for nanoimprint lithography on a second area of the substrate different from the first area of the substrate, the second amount of imprintable medium, when fixed, having a second etch rate as a physical characteristic thereof, wherein the second etch rate is different from the first etch rate; and
the control system configured to control imprinting at least part of an imprint template into both the first amount of imprintable medium and the second amount of imprintable medium when both the first and second amounts are on the substrate substantially at a same time.

2. The imprint lithography apparatus of claim 1, wherein a location, and/or extent, and/or etch rate of the first amount of imprintable medium, and/or a location, and/or extent, and/or etch rate of the second amount of imprintable medium, is related to a property of an imprint template that is to be used to imprint a pattern into the first amount of imprintable medium and second amount of imprintable medium, wherein the property is a uniformity profile of the imprint template.

3. The imprint lithography apparatus of claim 1, wherein for an area of the substrate onto which a part of an imprint template is to be imprinted, one or more of the following is undertaken: if the part of the imprint template for that area of the substrate has a dimension substantially as intended, that area of the substrate is provided with an amount of imprintable medium having a normal etch rate; and/or if a part of the imprint template for that area of the substrate has a dimension smaller than intended, that area of the substrate is provided with an amount of imprintable medium having an etch rate that is lower than the normal etch rate; and/or if a part of the imprint template for that area of the substrate has a dimension larger than intended, that area of the substrate is provided with an amount of imprintable medium having an etch rate that is higher than the normal etch rate.

4. The imprint lithography apparatus of claim 1, wherein for an area of the substrate onto which a part of an imprint template is to be imprinted, one or more of the following is undertaken: if processing of pattern features provided by that imprint would result in a pattern feature on that area of the substrate having a dimension being substantially as intended, that area of the substrate is provided with an amount of imprintable medium having a normal etch rate; and/or if processing of pattern features provided by that imprint would result in a pattern feature on that area of the substrate having a dimension being smaller than intended, that area of the substrate is provided with an amount of imprintable medium having an etch rate that is lower than the normal etch rate; and/or if processing of pattern features provided by that imprint would result in a pattern feature on that area of the substrate having a dimension being larger than intended, that area of the substrate is provided with an amount of imprintable medium having an etch rate that is higher than the normal etch rate.

5. The imprint lithography apparatus of claim 1, wherein the first etch rate is different from the second etch rate due to a difference in an amount of etch resistant material in the first amount of imprintable medium and the second amount of imprintable medium.

6. The imprint lithography apparatus of claim 1, wherein the first amount of imprintable medium, and/or the second amount of imprintable medium, is provided in a liquid form, and then subsequently fixed by exposure to radiation, or by heating, or by cooling, or by evaporation of a solvent.

7. The imprint lithography apparatus of claim 1, wherein the first amount of imprintable medium, and/or the second amount of imprintable medium, is provided in the form of one or more droplets.

8. The imprint lithography apparatus of claim 1, wherein the control system is further configured to control etching of the first and second amounts of imprintable medium.

9. The imprint lithography apparatus of claim 1, wherein provision of the first amount of imprintable medium comprises provision of a first component that, when fixed, has a first component etch rate, and a second component that, when fixed, has a second-component etch rate different from the first component etch rate, a first ratio of the first to second component dictating the first etch rate of the first amount of imprintable medium; and/or provision of the second amount of imprintable medium comprises provision of a third component that, when fixed, has a third component etch rate, and a fourth component that, when fixed, has a fourth component etch rate different from the third component etch rate, a second ratio of the third to fourth component dictating the second etch rate of the second amount of imprintable medium.

10. The imprint lithography apparatus of claim 9, wherein the first ratio and/or the second ratio is different for different areas of the substrate.

11. The imprint lithography apparatus of claim 10, wherein the first ratio and/or the second ratio is increased for successive imprints on the substrate, or decreased for successive imprints on the substrate.

12. The imprint lithography apparatus of claim 1, wherein provision of the first amount of imprintable medium comprises provision of a first component and a second component, an amount of the second component dictating the first etch rate of the first amount of imprintable medium when fixed; and/or provision of the second amount of imprintable medium comprises provision of a first component and a second component, an amount of the second component dictating the second etch rate of the second amount of imprintable medium when fixed.

13. The imprint lithography apparatus of claim 12, wherein the first and second components are provided together.

14. The imprint lithography apparatus of claim 12, wherein the first and second components are provided separately.

15. The imprint lithography apparatus of claim 12, wherein the amount of the second component is different for different areas of the substrate.

16. The imprint lithography apparatus of claim 15, wherein the amount of the second component is increased for successive imprints on the substrate, or decreased for successive imprints on the substrate.

17. An imprint lithography apparatus, comprising:
an imprintable medium dispenser;
a control system, the control system configured to control the imprintable medium dispenser in order to:
provide a first amount of imprintable medium for nanoimprint lithography on a first area of a substrate, the first amount of imprintable medium, when fixed, having a first etch rate, and
provide a second amount of imprintable medium for nanoimprint lithography on a second area of the substrate different from the first area of the substrate, the second amount of imprintable medium, when fixed, having a second etch rate, wherein the second etch rate is different from the first etch rate; and
the control system configured to control imprinting at least part of an imprint template into both the first amount of imprintable medium and the second amount of imprintable medium at a substantially same time.

18. The imprint lithography apparatus of claim 17, wherein the first etch rate is different from the second etch rate due to a difference in an amount of etch resistant material in the first amount of imprintable medium and the second amount of imprintable medium.

19. The imprint lithography apparatus of claim 17, wherein the control system is further configured to control etching of the first and second amounts of imprintable medium.

20. An imprint lithography apparatus, comprising:
a substrate table configured to hold a substrate;
an imprint template holder configured to hold an imprint template; and
a control system, the control system configured to control the imprint template holder to imprint at least part of the imprint template into a first amount of imprintable medium for nanoimprint lithography on a first area of the substrate and into a second amount of imprintable medium for nanoimprint lithography on a second area of the substrate different from the first area of the substrate, when both the first and second amounts are on the substrate substantially at a same time, the first amount of imprintable medium, when fixed, having a first etch rate as a physical characteristic thereof and the second amount of imprintable medium, when fixed, having a second etch rate as a physical characteristic thereof, wherein the second etch rate is different from the first etch rate; and
the control system configured to control etching of the first and second amounts of imprintable medium.

\* \* \* \* \*